United States Patent
Pickett et al.

(10) Patent No.: US 8,767,449 B2
(45) Date of Patent: Jul. 1, 2014

(54) MEMORY DEVICES WITH IN-BIT CURRENT LIMITERS

(75) Inventors: Matthew D. Pickett, San Francisco, CA (US); Gilberto Medeiros Ribeiro, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 89 days.

(21) Appl. No.: 13/536,602

(22) Filed: Jun. 28, 2012

(65) Prior Publication Data
US 2014/0003139 A1  Jan. 2, 2014

(51) Int. Cl.
G11C 11/24 (2006.01)
G11C 11/39 (2006.01)

(52) U.S. Cl.
CPC .................................... *G11C 11/39* (2013.01)
USPC ........................................ 365/159; 365/148

(58) Field of Classification Search
CPC .............................................. G11C 2211/5614
USPC ................................................ 365/148, 159
See application file for complete search history.

(56) References Cited

U.S. PATENT DOCUMENTS

| | | | |
|---|---|---|---|
| 7,701,758 B2 | 4/2010 | Nakai et al. | |
| 7,936,585 B2 | 5/2011 | Tian et al. | |
| 7,969,771 B2 | 6/2011 | Xi et al. | |
| 2011/0063904 A1 | 3/2011 | Chang et al. | |
| 2011/0266515 A1* | 11/2011 | Pickett et al. | 257/5 |
| 2012/0075914 A1* | 3/2012 | Bateman et al. | 365/148 |
| 2012/0105159 A1* | 5/2012 | Strachan et al. | 331/2 |
| 2012/0314468 A1* | 12/2012 | Siau et al. | 365/66 |
| 2013/0176766 A1* | 7/2013 | Pickett et al. | 365/148 |
| 2013/0242637 A1* | 9/2013 | Yang et al. | 365/148 |

OTHER PUBLICATIONS

Liu, X. et al., Diode-less bilayer oxide (WOx—NbOx) device for cross-point resistive memory applications, (Research Paper), Nanotechnology, Nov. 4, 2011, vol. 22, No. 47.

* cited by examiner

Primary Examiner — Hoai V Ho

(57) ABSTRACT

A memory device includes a first conductive layer, a second conductive layer, an in-bit current limiter including a voltage controlled negative differential resistance (VC-NDR) layer in electrical contact with the first conductive layer and a memristor element in electrical contact with the VC-NDR layer and the second conductive layer. A method for programming a memory device that comprises a VC-NDR device is also provided.

19 Claims, 4 Drawing Sheets

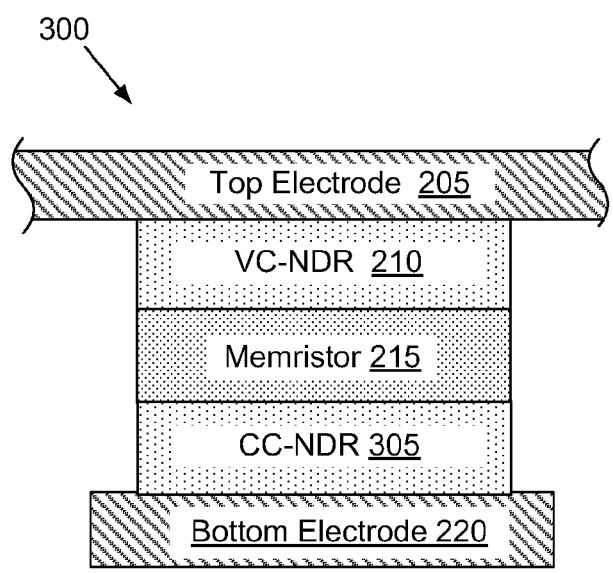 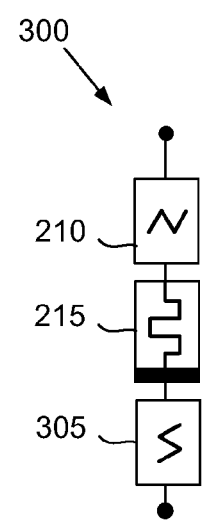
*Fig. 2D*  *Fig. 2E*

MEMORY DEVICES WITH IN-BIT CURRENT LIMITERS

BACKGROUND

Memristors are devices that can be programmed to different resistive states by applying programming energy. After programming, the state of the memristor can be read and remains stable over a specified time period. Memristors can be used in a variety of applications, including non-volatile solid state memory, programmable logic, signal processing, neural networks, control systems, pattern recognition, and other applications.

BRIEF DESCRIPTION OF THE DRAWINGS

The accompanying drawings illustrate various examples of the principles described herein and are a part of the specification. The illustrated examples are merely examples and do not limit the scope of the claims.

FIG. 2D shows a cross sectional diagram of a memory device that includes a memristor element, VC-NDR in-bit current limiters and current controlled negative differential resistance element, according to one example of principles described herein.

FIG. 2E is an electrical schematic of the memory device shown in FIG. 2D, according to one example of principles described herein.

Throughout the drawings, identical reference numbers designate similar, but not necessarily identical, elements.

DETAILED DESCRIPTION

Memristor failure can occur when the memristor is programmed from a high resistance state to a low resistance state. In some implementations, the writing process involves applying a constant programming voltage across the memristor. The failure of the memristor typically occurs due to overwriting since the current is not actively constrained during a voltage pulse. During the programming, the initial resistance of the memristor is high and a correspondingly low current flows through the device when a programming voltage is applied. However, as the resistance of the memristor rapidly drops during the programming process, larger currents surge through the device. These larger currents can cause the device to heat up and increase the rate at which the resistance drops. This positive feedback cycle can result in destructive currents flowing through the memristor that permanently damage it.

This effect can be mitigated to some degree when testing a single device by placing a resistor or transistor in series with the memristor in order to limit write current to a controlled maximum. However, these approaches to over-writing mitigation are not practical for memristor crossbars. This is because the series resistor reduces the switching margin of the device as visible from outside the crossbar and eliminates device nonlinearity. Transistors cannot be placed in each memristor device and cannot constrain current through a single memristor from the periphery of an array.

The principles below describe an in-bit current limiter that does not affect device nonlinearity or switching margin, but does limit the total current through the device. In one example, a voltage-controlled negative differential resistance (VC-NDR) element is used as the in-bit current limiter. These VC-NDR devices may be fabricated from oxides which exhibit a temperature or current driven metal-to-insulator transition.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples.

Figure 1:
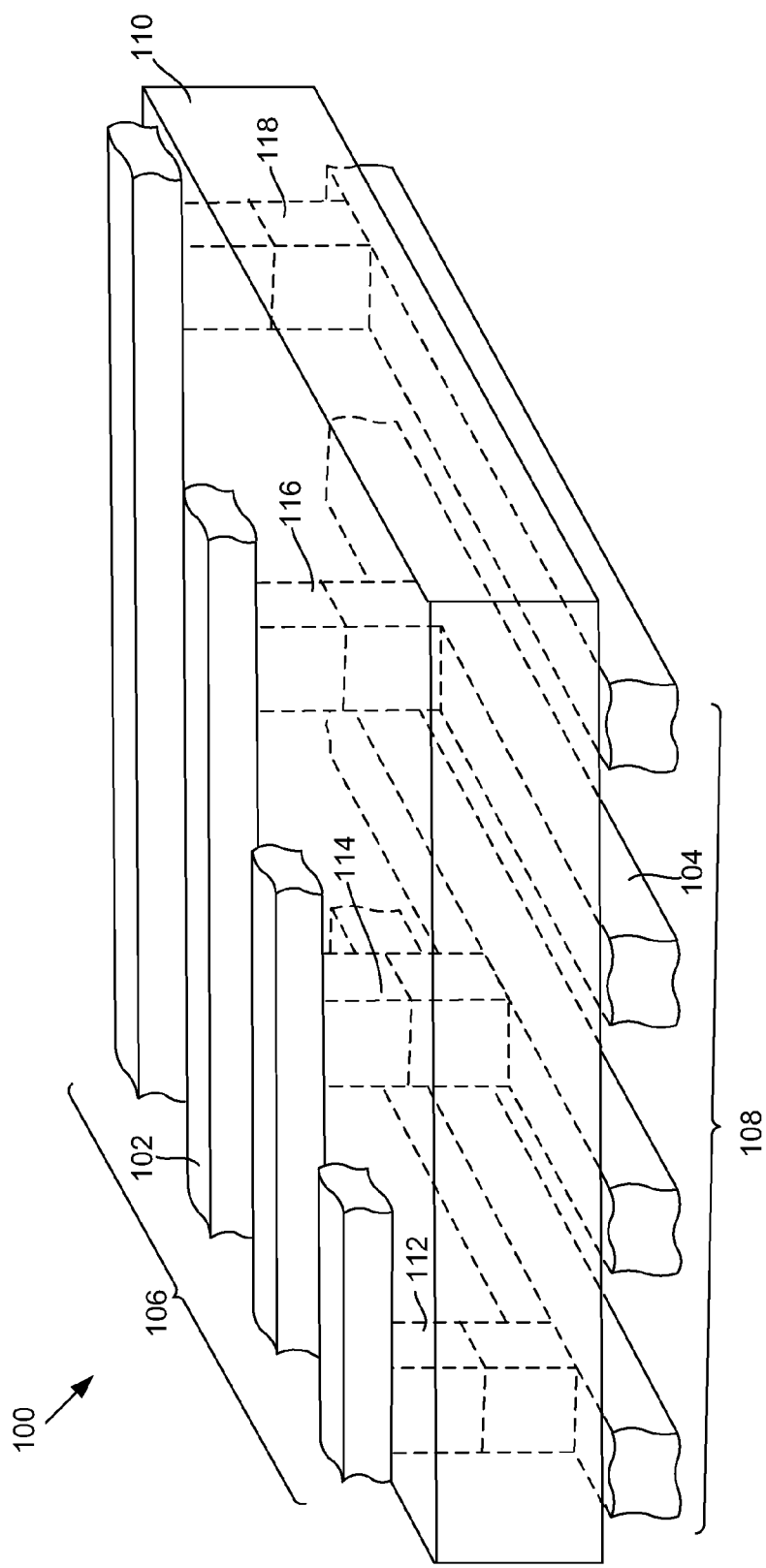
FIG. 1 is a perspective view of a crossbar array with memristor elements with in-bit current limiters, according to one example of principles described herein.

FIG. 1 is a perspective view of a crossbar array (100) that includes a first group of conductors (106) and a second group of conductors (108). The first group of conductors (106) crosses the second group of conductors (108) to form intersections. At the intersections, memory devices (112, 114, 116, 118) are formed between conductors in the first group and conductors in the second group. For example, a memory device (116) has been formed between a conductor (102) in the first group of conductors and a conductor (104) in the second group of conductors. For purposes of description, only a small portion of the crossbar array has been illustrated. The crossbar array may include many more conductors, intersections, and memory devices.

In this example, the memory devices (112, 144, 116, 118) include multiple layers. A first layer may be a memristor element and a second layer may be a VC-NDR element that serves as an in-bit current limiter.

Figure 2A:
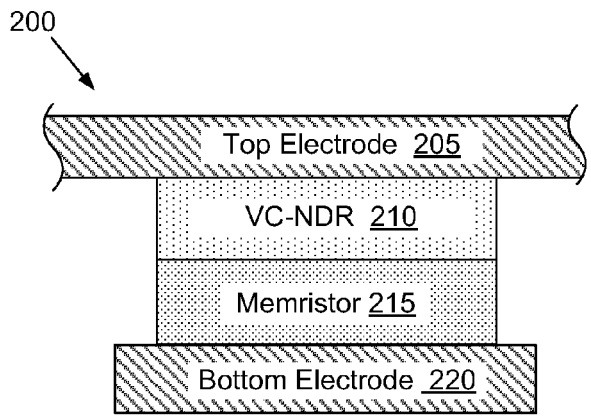
FIG. 2A shows a cross sectional diagram of a memory device that includes a memristor and VC-NDR in-bit current limiter, according to one example of principles described herein.
Figure 2B:
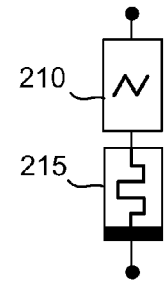
FIG. 2B is an electrical schematic of the memory device shown in FIG. 2A, according to one example of principles described herein.
Figure 2C:
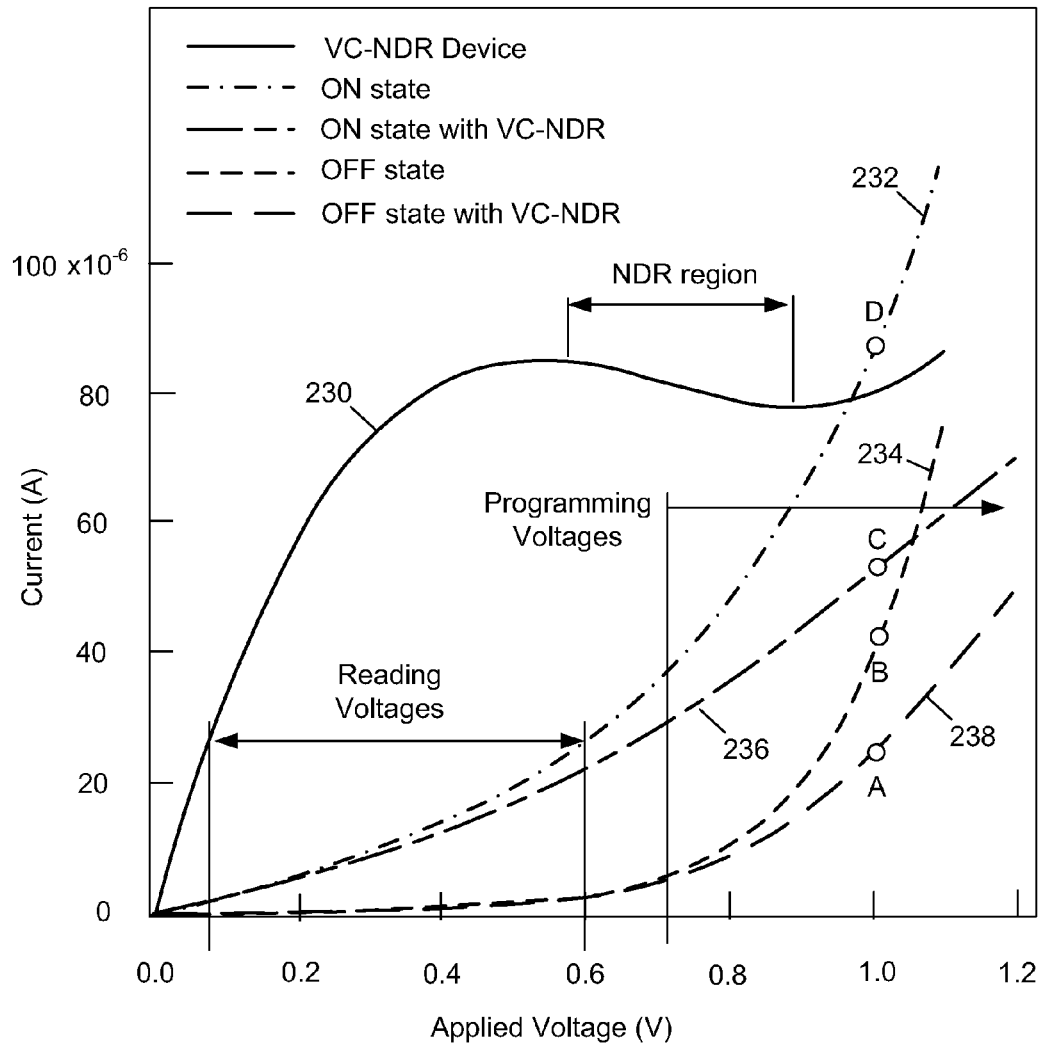
FIG. 2C is a graph of electrical behavior of a memory device that includes a memristor element and a voltage controlled negative differential resistance (VC-NDR) element, according to one example of principles described herein.

FIGS. 2A-2C describe one implementation of memory device (200, FIG. 2A) that includes a VC-NDR element (210) and a memristor element (215). Negative Differential Resistance (NDR) is a property displayed by some devices where an increase in current across the device results in a decreased voltage across the device in some operational regimes. In a VC-NDR element, an increase in voltage across the element may result in a decreased amount of current for some operational regimes. For example, VC-NDR element may be made from a variety of materials that exhibit a voltage controlled insulator/conductive phase transformation. These materials include, but are not limited to, metal oxides and nitrides. For example, these materials may include vanadium oxide, niobium oxide, binary titanium oxide, nickel monoxide, molybdenum oxides, tungsten oxides, manganese oxides, and other appropriate materials.

Memristor elements (215) are nonlinear systems that exhibit reversible and nonvolatile resistance changes that depend on the magnitude and duration of applied electrical energy. The memristor elements may be unipolar or bipolar. Unipolar memristance refers to a material that exhibits nonvolatile changes in resistance when programmed by a unipolar voltage. For example, a first programming voltage may be applied to a unipolar memristor element. The first programming voltage alters the electrical resistance of the unipolar memristor element to a low resistance state. After the first programming voltage is removed, the unipolar memristor device maintains the low resistance state until another programming voltage is applied. In general, voltages applied to the unipolar memristor element during the normal operation of the memory device (200) are below the voltage threshold which would alter the state of the unipolar memristor element. A second programming voltage with the same polarity as the first programming voltage, but different magnitude, can be applied to the unipolar memristor element to change its resistance to a high resistance state. Without being bound by any particular theory of operation, it appears that the first programming voltage may create a metallic phase conductive filament. This metallic phase conductive filament dramatically reduces the electrical resistance through the memristor element (215). Applying a second programming voltage of the same polarity, but different magnitude, is used to dissipate the metallic phase conductive filament and increase the electrical resistance of the memristor element (215). Examples of materials that can be used to form unipolar memristor elements include nickel oxide (NiO), and silicon oxide ($SiO_2$).

Additionally or alternatively, a bipolar memristor element (215) can be used within the memory device (200). Bipolar memristor elements are typically programmed by applying a first programming voltage with a first polarity to achieve an increase or decrease in electrical resistance and a second programming voltage with an opposite polarity to reverse the change in electrical resistance and return the memristor element to its prior state. Bipolar memristor elements may be formed from a variety of materials including tantalum oxide ($Ta_2O_5$), hafnium oxide ($HfO_2$), titanium oxide ($TiO_2$), and zirconium oxide ($ZrO_2$). In one example, motion of mobile dopants present in the memristor devices determines the changes in resistance of the memristor devices. Electrodes may be formed from a variety of conductive materials including metals and metal alloys. For example, the electrodes could be formed from platinum.

The VC-NDR in-bit current limiter (210) and the memristor element (215) are in electrical series between the top electrode and the bottom electrode. This is shown in the electrical schematic of FIG. 2B. A current passing between the electrodes flows through both the VC-NDR element and the memristor element. Consequently, as far as limiting current passing through the device, the order of the layers between the electrodes is not limiting. In the example shown in FIGS. 2A and 2B, the VC-NDR element (210) is sandwiched between the top electrode (205) and the memristor (215). Assuming that the top electrode and bottom electrode have the same electrical characteristics, the electrical behavior of the device would be equivalent if the locations of the memristor element (215) and VC-NDR element (210) were reversed.

FIG. 2C shows a graph of the electrical performance of the VC-NDR element (210) alone, the electrical performance of the memristor element (215) alone, and the electrical performance of a memory device (200) that combines the memristor element (215) with the VC-NDR element (210). The horizontal axis of the graph shows the voltage applied and the vertical axis shows the current flowing through a particular device. The electrical behavior of the VC-NDR element (210) and memristor (215) will be described separately and then the electrical behavior of memory device (200) that includes both VC-NDR element (210) and memristor (215) will be described.

The solid line (curve 230) shows the amount of current that flows through the VC-NDR element when a voltage between 0.0 and 1.2 is applied across the VC-NDR element. Between approximately 0 volts and 0.3 volts the current through the VC-NDR device increases rapidly as a function of increasing voltage. This is classical Ohmic behavior where current increases as a function of increasing voltage. At some predetermined threshold voltage or range of voltages, the behavior of the VC-NDR device changes from Ohmic behavior to exhibit nonlinear negative differential resistance. For the example shown in FIG. 2C, the predetermined threshold occurs between 0.3 and 0.5 volts and is indicated by a rapid decrease in the positive slope of the curve 230. Negative differential resistance in a voltage controlled device exhibits an "N" shaped current/voltage curve. Portions of the current/voltage curve (230) with negative slopes indicate that the amount of current passing through the device decreases as a function of increasing voltage. The portion of the VC-NDR current/voltage curve 230 between approximately 0.3 volts and 1 volt shows that the current flowing through the VC-NDR element is limited to approximately 75 to 85 microamperes. This is the current limiting region. These VC-NDR devices may be fabricated from a wide variety of oxides which exhibit a temperature or current driven metal-to-insulator transition. VC-NDR devices may additionally be fabricated from two-terminal semiconductor junctions that exhibit the Gunn effect or the Esaki effect.

The curve 232 represents the current/voltage behavior of a memristor element in its "ON" or low resistance state. The current flow through the memristor element in its "ON" state increases a function of applied voltage. This current/voltage curve 232 exhibits exponential type behavior, increasing slopes for higher voltages.

The curve 234 represents the current/voltage behavior of the memristor element in its "OFF" or high resistance state. This curve has lower currents for a given voltage than the curve 232 described above, but exhibits the same exponential type behavior.

In one example, a fixed programming voltage is applied across the memristor element (215) to program the memristor element from a low resistance state (ON) to a higher resistance state (OFF). In this example, the programming voltage is 1 volt and the initial state of the resistor in its OFF state is shown by point A in FIG. 2A. As discussed above, the application of a programming voltage initially results in low current levels passing through the memristor. In this example, point A corresponds to approximately 25 microamperes of current passing through the memristor.

As the memristor begins to transition from its OFF state to its ON state, the resistance of the memristor drops and the amount of current passing through the device dramatically increases. For example, point D in FIG. 2C shows that for a programming voltage of 1.0 volt, a current of approximately 90 microamperes passes through the memristor. As discussed above, the transition to lower and lower resistances during this transition is a positive feedback system: higher current produce lower resistances, which result in even higher currents and even lower resistances. This positive feedback cycle can generate a current spike through the memristor as it turns on. This current spike may irreversibly damage the memristor and render the memristor unfit for further use as a memory or switching element. For example, the memristor shown in FIG. 2 may be damaged by currents above 80 microamperes.

By including an in-bit current limiter (210) in series with the memristor, this current spike can be eliminated without adversely affecting device nonlinearity or switching margin. In one example, a voltage-controlled negative differential resistance (VC-NDR) element (210) is used as the in-bit current limiter for the memory device (200). The electrical performance of an illustrative memory device (200) is shown as a curve 236 for the "ON" state and a curve 238 for the "OFF" state.

The electrical resistance of the memory device (200) includes the combined electrical resistances of both the memristor element and the VC-NDR element. In the reading voltage range, the difference between the resistance in the "ON" state and the resistance in the "OFF" state is substantially similar to the memristor element alone. For example, at a reading voltage of 0.4 volts, the electrical resistance in the "ON" state is such that a current of approximately 15 microamperes flows through the memory device and in the "OFF" state a current of approximately 2-3 microamperes. This is substantially similar to the performance of the memristor alone.

However, when higher programming voltages are applied, the influence of the VC-NDR element is more pronounced. In this example, the programming voltages are voltages greater than approximately 0.75 volts. In this example, the VC-NDR element by itself limits currents to no greater than 85 microamperes over the entire range of programming voltages. This ceiling, by itself, is sufficient to prevent the memristor element from being destroyed during the programming process. Despite the positive feedback between the electrical resistance of the memristor and the current through the memristors during programming, the VC-NDR element limits current through the device to levels that would not damage the memristor. The example above illustrates one specific current limit created by the VC-NDR element to protect the device. The current limit can be scaled for a given combination of materials and geometries. For example, the VC-NDR element can be engineered to exhibit a desired current limit that is below the damage threshold for the memristor element.

When the VC-NDR element is combined in series with the memristor element, their combined electrical resistances are added together and result in even lower current. For example, for a programming voltage of 1 volt, the current through the memory device in its "OFF" state is approximately 25 microamperes. This is shown by point A on the curve 238. When the memory device is in its "ON" state, the current through the device is limited to approximately 55 microamperes. This is shown by point C on the curve 236. This represents the maximum current that will pass through the memory device for this programming voltage. This maximum current is insufficient to cause significant damage to the memristor. Consequently, by using an in-bit current limiter formed from a VC-NDR device, the lifetime of the memristor element in the memory device can be significantly prolonged. This leads to more robust memory devices that can withstand significantly more programming cycles before failure.

FIG. 2D shows a cross sectional diagram of a memory device that includes a memristor, VC-NDR in-bit current limiter and current controlled negative differential resistance (CC-NDR) element. The CC-NDR element may be formed from a variety of materials including vanadium oxide, niobium oxide, zirconium oxide, tungsten oxide, chromium oxide or alloys thereof and other materials with a negative thermal coefficient of resistance, and other appropriate materials or structures.

As discussed above, the VC-NDR in-bit current limiter (210) limits currents during programming to prevent damage to the memory device (300) but has minimal effects on the electrical characteristics of the system. The CC-NDR layer performs a different function. The CC-NDR layer increases the electrical resistance of the OFF state of the memristor device for low voltages. High resistance in the OFF state can be useful in preventing leakage through devices that are not selected for reading. As discussed above, to read the state of a particular memory device, a voltage can be applied to the two crossbars that form the intersection where the memory device is located. The only memory device that sees the full voltage is the target memory device that is between the two cross bars. However, other devices are connected to the crossbars. These devices are "half selected" because they see only the voltage applied to one of the two crossbars. If the electrical resistance of the "half selected" devices is not fairly high, leakage currents can pass through the half selected devices. These leakage currents can be thought of as "parasitic currents" that obscure the desired reading of the target memory device.

The inclusion of a CC-NDR element in the memory devices increases the resistance of the memory devices when very low voltages are applied and substantially reduces the leakage currents. This allows the state of the target device to be more clearly distinguished. For example, a read voltage of 0.3 volts may be applied across the target memory device by applying 0.15 volts to a first crossbar and 0.15 to a second crossbar that intersects the first cross bar. Thus, the target memory device at the intersection of the first crossbar and second crossbar sees 0.3 volts while "half selected" memory devices that are attached to either of the first crossbar or the second crossbar are exposed to only 0.15 volts. Inclusion of the CC-NDR element in the memory devices can substantially increase the resistance of the devices at 0.15 volts without undesirably disturbing the behavior of the memory devices at the reading voltage of 0.3 volts.

FIG. 2E is an electrical schematic of the memory device shown in FIG. 2D. This schematic shows that the memory device includes a VC-NDR element, a memristor element, and a CC-NDR element in series between the top electrode and the bottom electrode. As discussed above, the elements between the top electrode and bottom electrode can be arranged in any desired or convenient order.

Layers in the devices shown above may be deposited in a number of ways. Some of the layers may be deposited using one technique and other layers in the same device may be deposited with another technique. The layers may be deposited using chemical vapor deposition, sputtering, reactive sputtering, plating, physical vapor deposition, spin coating, pulsed laser deposition, or any other suitable deposition technique. For example, the conductive layers may be deposited using plating and the oxide layers may be deposited using sputtering. For example, the various layers may be formed using thin film deposition techniques. In general, the term "thin film" refers to layers of material ranging from fractions of a nanometer (monolayer) to layers that are several micrometers in thickness.

Figure 3:
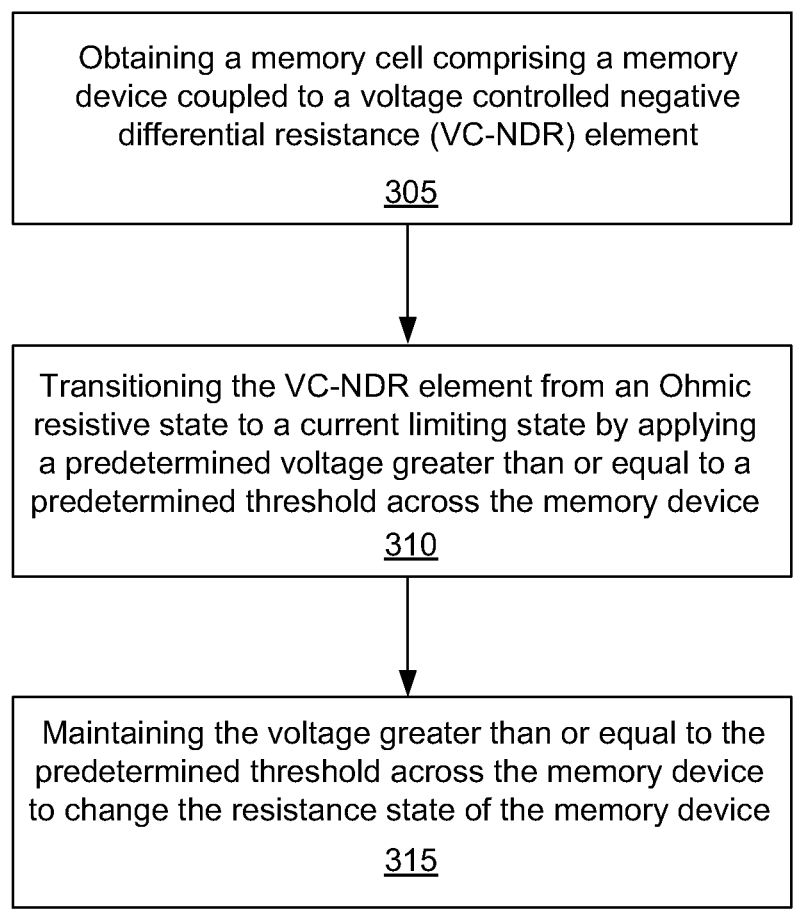
FIG. 3 is a flowchart showing an illustrative method for programming a memory device that includes a memristor and a voltage controlled negative differential resistance element, according to one example of principles described herein.

FIG. 3 is flowchart showing a method for programming a memory device that includes a memristor and a VC-NDR element. The method includes obtaining a memory cell comprising a memory device coupled to a voltage controlled negative differential resistance (VC-NDR) element (block 305). The VC-NDR element is selected and constructed to have a current limiting region that corresponds to programming voltages applied to the memristor element. The VC-NDR element transitions from an Ohmic resistive state to a current limiting state by applying a voltage greater than or equal to a predetermined threshold across the memristor element (block 310). The voltage is greater than or equal to the predetermined threshold across the memory cell to change the resistance state of the memory device. The predetermined threshold is within the current limiting range of the VC-NDR element and also within the range of programming voltages that cause a change of state in the memristor element. Applying a voltage at least as large as the predetermined threshold allows the current to be limited by the VC-NDR element while state of the memristor element is altered.

The voltage greater than or equal to the predetermined threshold is maintained across the memory device to change the resistance state of the memory device (block 315). In one implementation, the voltage may be a fixed voltage that is maintained across the memory device for a predetermined period of time. In other examples, the voltage may be a chain of voltage pulses that are applied. There may be a fixed number of voltage pulses or measurements can be made between pulses to determine if the desired change in state was achieved. If the desired change in state was achieved, no further pulses are applied. If the desired change in state was not achieved, pulses can continue to be applied until the desired change in state is achieved. In some examples, the magnitude or duration of the pulses may be changed as well.

The principles above describe an in-bit current limiter that does not adversely affect device nonlinearity or switching margin, but does limit the total current through the device. In one example, a voltage-controlled negative differential resistance (VC-NDR) element is used as the in-bit current limiter. Additionally, a current-controlled negative differential resistance (CC-NDR) element may be used to reduce leakage currents within a memory array.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A memory device comprising:
a first conductive layer;
a second conductive layer;
an in-bit current limiter comprising a voltage controlled negative differential resistance (VC-NDR) element in electrical contact with the first conductive layer; and
a memristor element in electrical contact with the VC-NDR element and the second conductive layer;
wherein said VC-NDR is engineered to exhibit a predetermined current limit that is below a damage threshold for said memristor element.

2. The device of claim 1, in which the memristive element comprises a memristive matrix and mobile dopants within the memristive matrix.

3. The device of claim 1, in which the VC-NDR element comprises one of: at least one metal oxide layer; a semiconductor junction; and a combination of a metal oxide layer and a semiconductor layer.

4. The device of claim 1, in which the first conductive layer and second conductive layer are intersecting crossbars in a crossbar array.

5. The device of claim 1, further comprising a programming voltage applied across the first conductor layer and second conductor layer, in which the VC-NDR element limits current through the memory device during application of the programming voltage.

6. The device of claim 1, further comprising a current-controlled negative differential resistance (CC-NDR) element in electrical series with the VC-NDR element and memristor element.

7. The device of claim 1, in which the VC-NDR element comprises a voltage current curve with a current limiting region that corresponds to programming voltages applied to the memristor element.

8. A crossbar memory array comprising:
a first crossbar;
a second crossbar intersecting the first crossbar;
a memory device sandwiched between the first crossbar and second crossbar at an intersection between the first crossbar and second crossbar, the memory device comprising:
a memristor element;
a voltage controlled negative differential resistance (VC-NDR) element to transition from an Ohmic resistive state to a current limiting state in response to a voltage greater than or equal to a predetermined threshold, the current limiting state extending over a predetermined range of programming voltages; and
a current-controlled negative differential resistance (CC-NDR) element in electrical series with the VC-NDR element and memristor element.

9. The array of claim 8, in which the CC-NDR element limits leakage currents at voltages lower than a reading voltage applied to the memory device to determine the state of the memory device.

10. The array of claim 8, in which the VC-NDR layer comprises a voltage current curve with a current limiting region that corresponds to programming voltages applied to the memristor element.

11. A method comprising,
with a memory device comprising a memristor element coupled to a voltage controlled negative differential resistance (VC-NDR) element;
transitioning the VC-NDR element from an Ohmic resistive state to a current limiting state by applying a programming voltage greater than or equal to a predetermined threshold across the memory device;
with said VC-NDR, limiting current to a predetermined current limit that is below a damage threshold for said memristor element; and
maintaining the programming voltage greater than or equal to the predetermined threshold across the memory device to change the resistance state of the memory device.

12. The method of claim 11, in which maintaining the programming voltage comprises applying a fixed voltage across the memory device.

13. The method of claim 11, in which maintaining the programming voltage comprises applying a chain of voltage pulses across the memory device.

14. The method of claim 11, further comprising selecting the VC-NDR element with a current limiting region that corresponds to programming voltages applied to the memristor element.

15. The array of claim 8, wherein said VC-NDR is engineered to exhibit a predetermined current limit that is below a damage threshold for said memristor element.

16. The device of claim 6, wherein said memristor element is sandwiched between said CC-NDR and said VC-NDR.

17. The array of claim 8, wherein said memristor element is sandwiched between said CC-NDR and said VC-NDR.

18. The array of claim 8, wherein the memristive element comprises a memristive matrix and mobile dopants within the memristive matrix.

19. The device of claim 6, wherein the CC-NDR element limits leakage currents at voltages lower than a reading voltage applied to the memory device to determine the state of the memory device.

* * * * *